(12) United States Patent
Sano et al.

(10) Patent No.: US 10,170,530 B2
(45) Date of Patent: Jan. 1, 2019

(54) DISPLAY DEVICE INCLUDING FIRST AND SECOND SUBSTRATES, ONE INCLUDING A PAD ELECTRODE

(71) Applicant: Japan Display Inc., Minato-ku (JP)

(72) Inventors: Takumi Sano, Tokyo (JP); Yasushi Kawata, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/449,033

(22) Filed: Mar. 3, 2017

(65) Prior Publication Data

US 2017/0256600 A1   Sep. 7, 2017

(30) Foreign Application Priority Data

Mar. 4, 2016  (JP) ................................ 2016-042462

(51) Int. Cl.
| | | |
|---|---|---|
| *H01L 29/205* | (2006.01) | |
| *H01L 33/00* | (2010.01) | |
| *H01L 27/32* | (2006.01) | |
| *H01L 51/00* | (2006.01) | |
| *H01L 51/52* | (2006.01) | |

(52) U.S. Cl.
CPC ...... *H01L 27/3276* (2013.01); *H01L 51/0096* (2013.01); *H01L 51/5237* (2013.01)

(58) Field of Classification Search
CPC ............. H01L 27/3276; H01L 51/5237; H01L 51/0096
See application file for complete search history.

(56) References Cited

U.S. PATENT DOCUMENTS

| | | | |
|---|---|---|---|
| 2012/0138940 A1* | 6/2012 | Sato | ..................... H01L 27/1218 257/59 |
| 2012/0140424 A1* | 6/2012 | Sato | ........................ G02F 1/167 361/749 |
| 2014/0361183 A1 | 12/2014 | Takeda et al. | |
| 2016/0349567 A1* | 12/2016 | Kwon | ............... G02F 1/133308 |
| 2017/0176808 A1* | 6/2017 | Sano | ................ G02F 1/133308 |
| 2017/0179159 A1* | 6/2017 | Kawata | ............... G02F 1/13452 |
| 2017/0244067 A1* | 8/2017 | Sano | ................... H01L 51/5256 |

FOREIGN PATENT DOCUMENTS

| | | |
|---|---|---|
| JP | 10-104651 A | 4/1998 |
| JP | 10-189883 A | 7/1998 |
| JP | 3479890 B2 | 12/2003 |
| JP | 2009-237410 A | 10/2009 |
| JP | 2014-236209 A | 12/2014 |

* cited by examiner

*Primary Examiner* — Ismail Muse
(74) *Attorney, Agent, or Firm* — Oblon, McClelland, Maier & Neustadt, L.L.P.

(57) ABSTRACT

According to one embodiment, a display device includes a first substrate including as insulating substrate with a first through hole, a pad electrode positioned above the insulating substrate, and a signal line electrically connected to the pad electrode, a second substrate opposed to the first substrate, a sealant which adheres the first substrate and the second substrate, a line substrate including a connection line and disposed below the insulating substrate, and a conductive material which electrically connects the pad electrode and the connection line, wherein the sealant is less absorptive than is the insulating substrate as to a wavelength less than 350 nm.

19 Claims, 10 Drawing Sheets

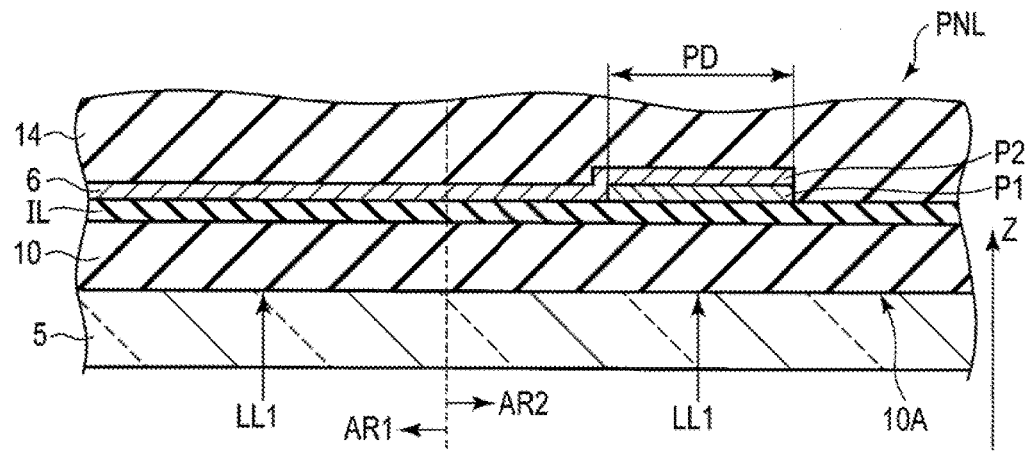
F I G. 6
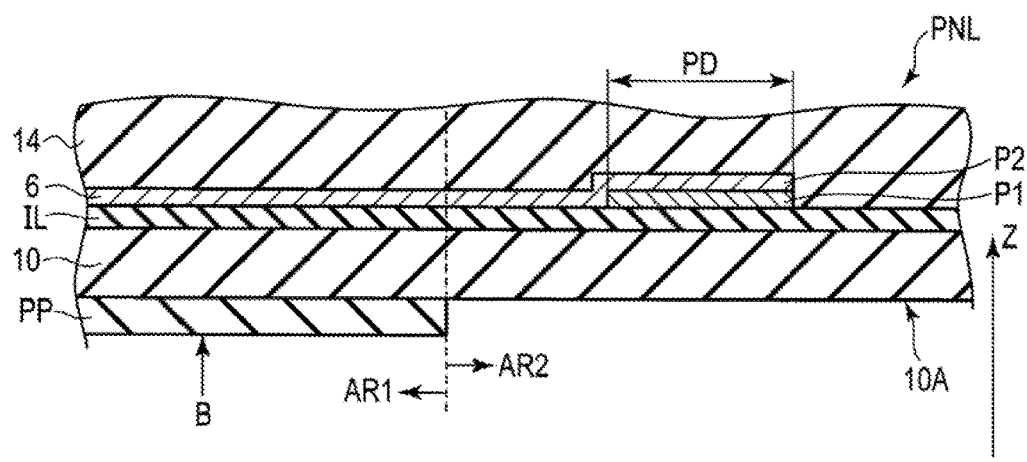
F I G. 7

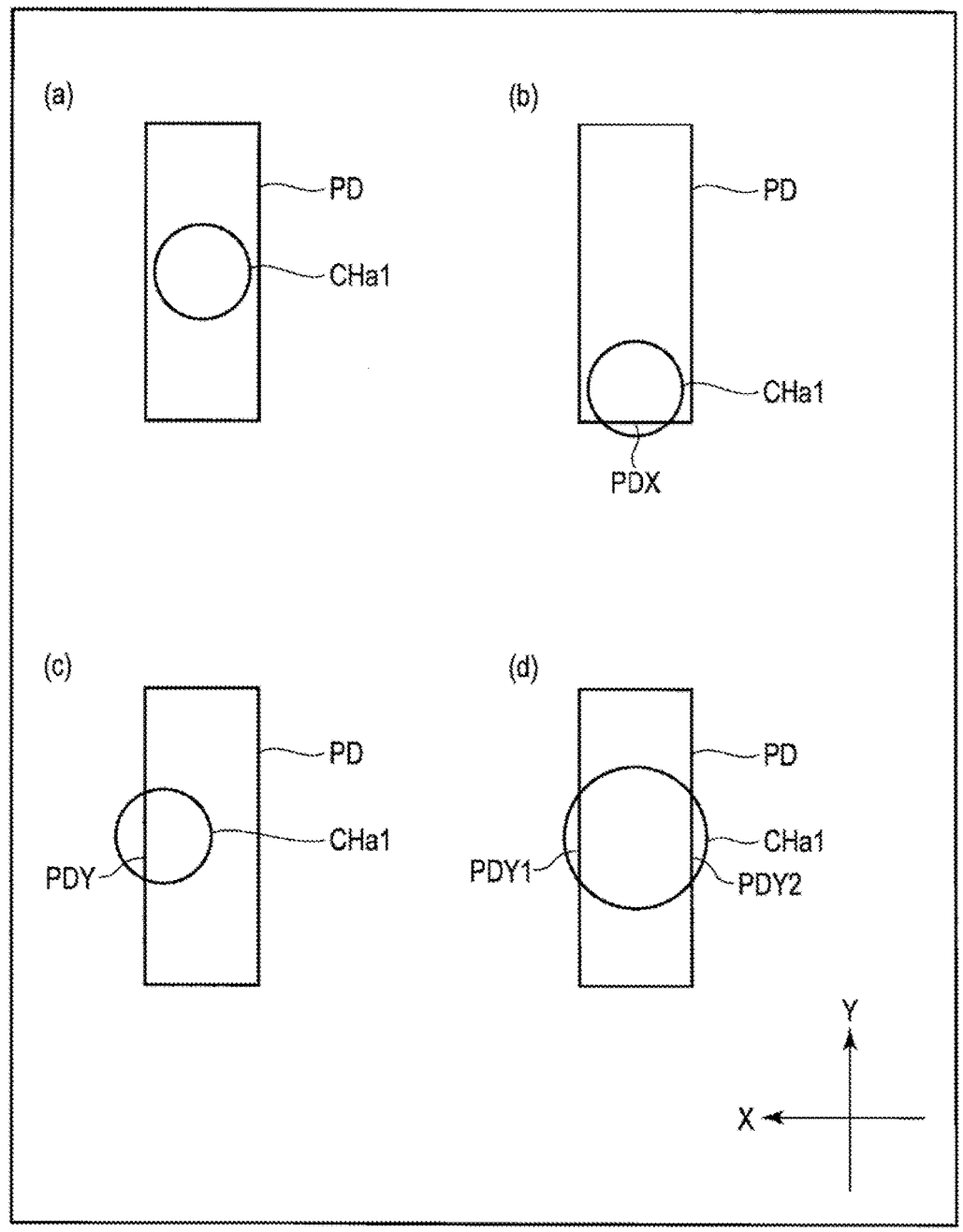
F I G. 12

US 10,170,530 B2

DISPLAY DEVICE INCLUDING FIRST AND SECOND SUBSTRATES, ONE INCLUDING A PAD ELECTRODE

CROSS-REFERENCE TO RELATED APPLICATIONS

This application is based upon and claims the benefit of priority from Japanese Patent Application No. 2016-042462, filed Mar. 4, 2016, the entire contents of which are incorporated herein by reference.

FIELD

Embodiments described herein relate generally to a display device.

BACKGROUND

In recent years, display devices with a greater display area are highly anticipated because of higher performance and advanced design in the technical field of mobile data communication devices such as mobile phone and personal digital assistant (PDA). For example, display devices including a thinner bezel structure are proposed.

Conventionally, there is a well-known structure in which a driver is mounted in the periphery of the display area on the substrate including electrodes. In display devices using such a structure of the driver, input signals and voltages are supplied to the driver through a line substrate such as a flexible printed circuit (FPC). On the other hand, instead of such a flexible printed circuit, there has been proposed a method to form an electrical connection between lines formed on the lower surface side of an array substrate and the driver formed on the upper surface side of the array substrate through a laser-formed contact hole passing through the array substrate.

BRIEF DESCRIPTION OF THE DRAWINGS

FIG. 6 is a plan view showing a process in which a support substrate is peeled off from the first insulating substrate.

FIG. 7 is a cross-sectional view showing a process in which a first protection member and a second protection member are adhered to the first insulating substrate.

FIG. 12 is a schematic plan view showing positional relationships between the pad electrode and the first contact hole.

DETAILED DESCRIPTION

Figure 1:
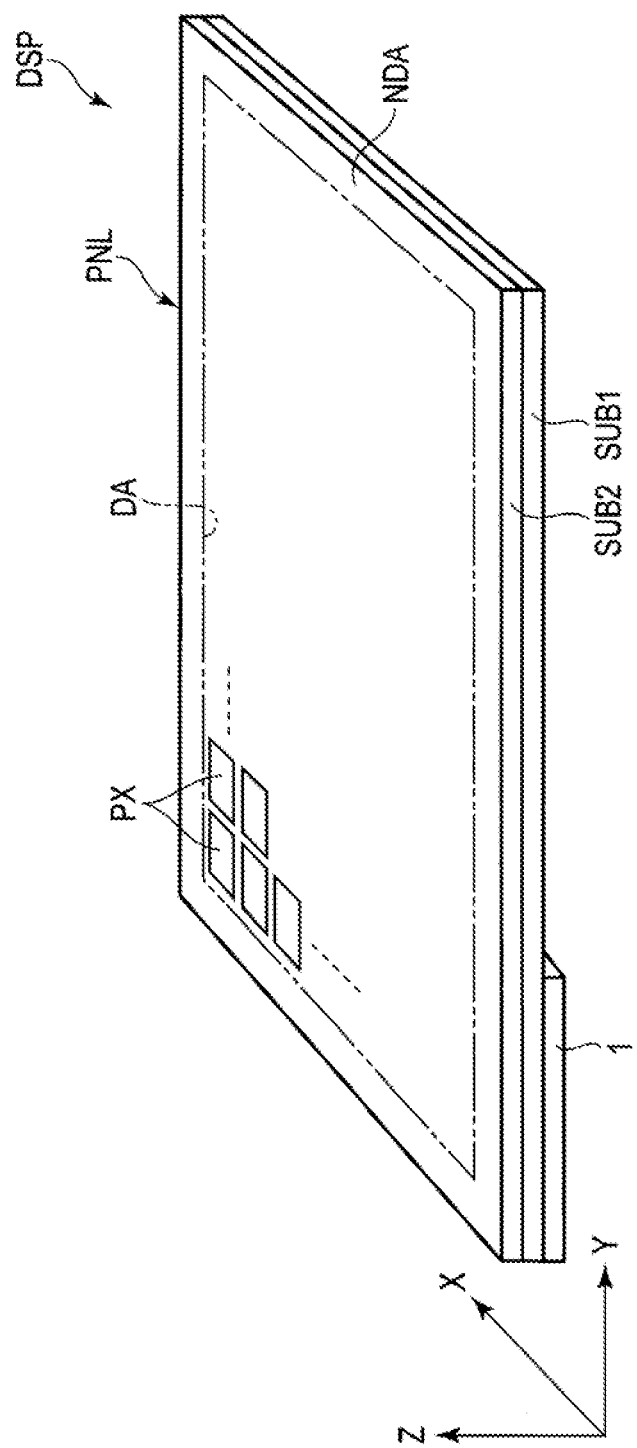
FIG. 1 is a schematic perspective view of the structure of a display device of an embodiment.

In general, according to one embodiment, a display device includes: a first substrate including an insulating substrate with a first through hole, a pad electrode positioned above the insulating substrate, and a signal line electrically connected to the pad electrode; a second substrate opposed to the first substrate; a sealant which adheres the first substrate and the second substrate; a line substrate including a connection line and disposed below the insulating substrate; and a conductive material which electrically connects the pad electrode and the connection line, wherein the sealant is less absorptive than is the insulating substrate as to a wavelength less than 350 nm.

According to one embodiment, a display device include: a first substrate including an insulating substrate with a first through hole, a pad electrode positioned above the insulating substrate, and a signal line electrically connected to the pad electrode; a second substrate opposed to the first substrate; an organic member positioned between the first substrate and the second substrate; a line substrate including a connection line and disposed below the insulating substrate; and a conductive material which electrically connects the pad electrode and the connection line, wherein the organic member is less absorptive than is the insulating substrate as to a wavelength less than 350 nm.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to snake the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless necessary.

Initially, a display device of a present embodiment will be explained. FIG. 1 is a schematic perspective view showing the structure of a display device DSP of the present embodiment. FIG. 1 shows a three-dimensional space which is defined by a first direction X, second direction Y which is orthogonal to the first direction X, and third direction Z which is orthogonal to the first direction X and the second direction Y. Note that, in this example, the first direction X and the second direction Y are orthogonal to each other; however, they may cross at an angle other than 90°. Furthermore, in the present embodiment, the display device is an organic electroluminescent (EL) display device.

As shown in FIG. 1, the display device DSP includes a display panel PNL and a line substrate 1. The display panel PNL includes a plate-like first substrate SUB1 and a plate-like second substrate SUB2 opposed to the first substrate SUB1.

In the present embodiment, the positive direction of a third direction Z, or the direction from the first substrate SUB1 to the second substrate SUB2 will be defined as up or above. The negative direction of the third direction Z, or the direction from the second substrate SUB2 to the first substrate SUB1 will be defined as down or below. Furthermore, phrases such as "a second member above a first member" and "a second member below a first member" may refer to either a case where the second member contacts the first member or a case where the second member is apart from the first member. In the latter case, a third member may be interposed between the first and second members. On the other hand, phrases such as "a second member on a first member" and "a second member on the bottom of a first member" refer to a case where the second member contacts the first member.

The display panel PNL includes a display area DA in which an image is displayed and a non-display area NDA which surrounds the display area DA. The display panel PNL includes a plurality of pixels PX within the display area DA. The pixels PX are arranged in a matrix in the first direction X and the second direction Y.

In the example depicted, a side edge of the first substrate SUB1 which is parallel to the first direction X and a side edge of the second substrate SUB2 which is parallel to the first direction X have a substantially same length. Furthermore, a side edge of the first substrate SUB1 which is parallel to the second direction Y and a side edge of the second substrate SUB2 which is parallel to the second direction Y have a substantially same length. That is, an area of the first substrate SUB1 which is parallel to the X-Y plane is substantially the same as an area of the second substrate SUB2 in the X-Y plane. In the present embodiment, each side edge of the first substrate SUB1 matches each corresponding edge of the second substrate SUB2 in the third direction Z.

The line substrate 1 is disposed below the display panel PNL. In this example, a side edge of the line substrate 1 which is parallel to the first direction X has a length shorter than or equal to the side edges of the first substrate SUB1 and the second substrate SUB2 which are parallel to the first direction X.

Furthermore, a side edge of the line substrate 1 which is parallel to the second direction Y has a length shorter than or equal to the side edges the first substrate SUB1 and the second substrate SUB2 which are parallel to the second direction Y. The line substrate 1 is disposed in both the non-display area NDA and the display area DA. Mote that the line substrate 1 does not go outside the area opposed to the display panel PNL. The display panel PNL and the line substrate 1 are electrically connected to each other.

Figure 2:
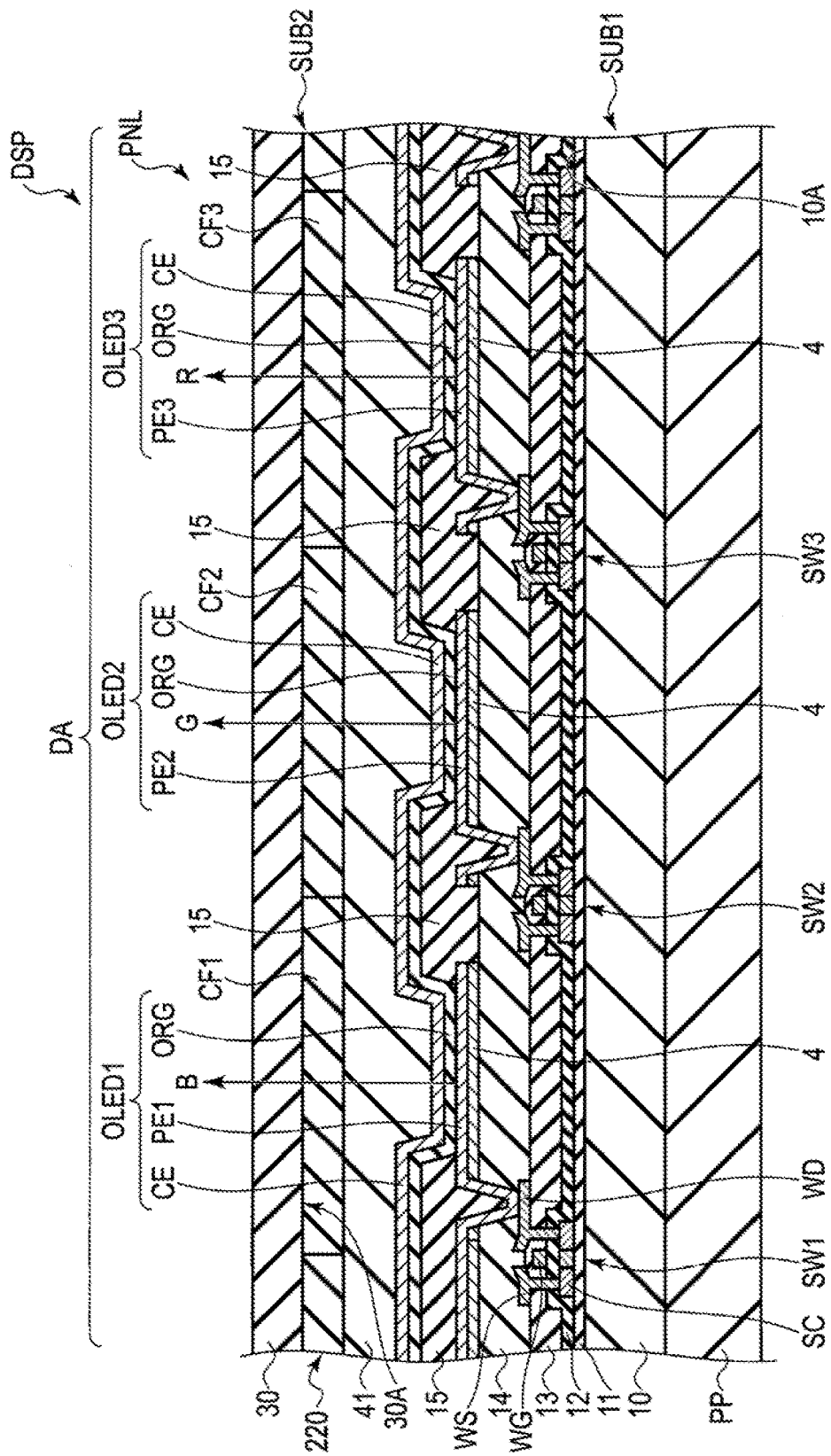
FIG. 2 is a cross-sectional view showing a display area of the display device of FIG. 1.

FIG. 2 is a cross-sectional view of a display area DA of the display device DSP of FIG. 1.

As shown in FIG. 2, the first substrate SUB1 includes, for example, a first insulating substrate 10, switching elements SW1, SW2, and SW3, reflective layer 4, organic EL elements OLED1, OLED2, and OLED3, and protection member PP. The first insulating substrate 10 is formed of an organic insulating material which is, for example, polyimide. The first insulating substrate 10 is covered with a first insulating film 11.

Switching elements SW1, SW2, and SW3 are formed above the first insulating film 11. In the example depicted, switching elements SW1, SW2, and SW3 are of top-gate type; however, they may be of bottom-gate type. Switching elements SW1, SW2, and SW3 are structured the same, and thus, the detailed structure of switching element SW1 will be explained as a typical example. The switching elements SW1 includes a semiconductor layer SC formed on the first insulating film 11. The semiconductor layer SC is covered with a second insulating film 12. Furthermore, the second insulating film 12 is disposed on the first insulating film 11.

A gate electrode WG of the switching element SW1 is formed on the second insulating film 12 and is positioned directly above the semiconductor layer SC. The gate electrode WG is covered with a third insulating film 13. The third insulating film 13 is disposed on the second insulating film 12.

The first, insulating film 11, second insulating film 12, and third insulating film 13 are formed of an inorganic material such as a silicon oxide or a silicon nitride.

A source electrode WS and a drain electrode WD of the switching element SW1 are formed on the third insulating film 13. The source electrode WS and the drain electrode WD are electrically connected to the semiconductor layer SC through a contact hole passing through the second insulating film 12 and the third insulating film 13. The switching element SW1 is covered with a fourth insulating film 14. The fourth insulating film 14 is disposed on the third insulating film 13. The fourth insulating film 14 is formed of an organic material such as transparent resin.

The reflective layer 4 is formed on the fourth insulating film 14. The reflective layer 4 is formed of a highly reflective metal material such as aluminum and silver. Note that the reflective layer 4 (that is, the surface in the second substrate SUB2 side) may have either a flat surface or an asperity for light dispersion.

Organic EL elements (light emitting elements) OLED1 to OLED3 are disposed between the first substrate SUB1 and the second substrate SUB2. Furthermore, the organic EL elements OLED1 to OLED3 are formed on the fourth insulating film 14. In the example depicted, the organic EL element OLED1 is electrically connected to the switching element SW1, the organic EL element OLED2 is electrically connected to the switching element SW2, and the organic EL element OLED3 is electrically connected to the switching element SW3. Each of the organic EL elements OLED1 to OLED3 is structured as a top-emission type which emits whit light toward the second substrate SUB2. The organic EL elements OLED1 to OLED3 have the same structure.

The organic EL elements OLED1 includes a positive electrode PE1 formed on the reflective layer 4. The positive electrode PE1 contacts the drain electrode WD of the switching element SW1 and is electrically connected to the switching element SW1. Similarly, the organic EL element OLED2 includes a positive electrode PE2 which is electrically connected to the switching element SW2 and the organic EL element OLED3 includes a positive electrode PE3 which is electrically connected to the switching element SW3. The positive electrodes PE1, PE2, and PE3 are formed of a transparent conductive material such as indium tin oxide (ITO) or indium zinc oxide (ISO).

The organic EL elements OLED1 to OLED3 each include an organic light emitting layer ORG and a common electrode (negative electrode) CE. The organic light emitting layer ORG is disposed on each of the positive electrodes PE1 to PE3. The common electrode CE is positioned above the organic light emitting layer ORG. The common electrode CE is formed of a transparent conductive material such as ITO or IZO. In the example depicted, the organic EL elements OLED1 to OLED3 are defined by ribs 15. Note that, although this is not depicted, each of the organic EL elements OLED1 to OLED3 is, preferably, sealed by a transparent shielding film.

The second substrate SUB2 is disposed above the first substrate SUB1. The second substrate SUB2 includes a second insulating substrate 30, a color filter layer 220 and the like. The second insulating substrate 30 may be a glass substrate or a resin substrate, or may be an optical device including an optical film, a polarizer, or the like.

The color filter layer 220 is disposed in the inner surface 30A side of the second insulating substrate 30. The color filter layer 220 includes color filters CF1, CF2, and CF3. The color filters CF1, CF2, and CF3 are formed of resin materials of different colors. In this example, the color filter CF1 is a blue color filter. The color filter CF2 is a green color filter. The color filter CF3 is a red color filter. Note that the color filter layer 220 may further include a white or a transparent color filter. The color filters CF1, CF2, and CF3 are opposed to the organic EL elements OLED1, OLED2, and OLED3, respectively.

The first substrate SUB1 and the second substrate SUB2 are adhered together by a transparent acrylate 41 in the display area DA. As will be described later, the first substrate SUB1 and the second substrate SUB2 may be adhered by the acrylate 41 in the non-display area NDA or by a sealant surrounding the display area DA in the non-display area NDA.

A protection member PP is disposed below the first insulating substrate 10. In the example, the protection member PP is adhered to the bottom of the first insulating substrate 10; however, an additional thin film may be interposed between the protection member PP and the first insulating substrate 10. The protection member PP is, preferably, formed of a material which exerts a good heat resistivity, gas insulation, anti-humidity, and strength, and also is cheap. The protection member PP is such heat resistive that it does not change or deform in a process temperature during a manufacturing process of the display device DSP. Furthermore, the protection member PP has a strength greater than that of the first insulating substrate 10 and functions as a supportive layer which suppresses bending of the display panel PNL. Furthermore, the protection member PP has an anti-humidity property to keep water or the like from entering the inside and a gas insulation property to keep gas or the like from entering the inside, and functions as a barrier layer. In the present embodiment, the protection member PP is a film formed of, for example, polyethylene terephthalate.

Note that, a metal layer may be formed below the protection member PP. The metal layer is, for example, a thin film deposited on the protection member PP, and another thin film may be interposed between the protection member PP and the metal layer. The metal layer is, preferably, formed of a material which exerts gas insulation greater than that of the protection member PP in consideration of the manufacturing process which will be described later, and such a material will be, for example, aluminum or an aluminum alloy.

In the above display device, when the organic EL elements OLED1 to OLED3 emit light, the light (white light) irradiated from the elements OLED1 to OLED3 exits through the color filters CF1, CF2, and CF3. Therein, the light of blue wave length in the white light irradiated from the organic EL element OLED1 passes the color filter CF1. Additionally, the light of green wave length in the white light irradiated from the organic EL element OLED2 passes the color filter CE2, and the light of red wave length in the white light irradiated from the organic EL element OLED3 passes the color filter CF3. Therefore, color image display can be achieved.

A pixel PX shown in FIG. 1 is, for example, a minimum unit of a color image, and includes the above-described organic EL elements OLED1 to OLED3.

Note that, in the above example, the organic EL elements OLED1 to OLED3 include a common organic light emitting layer ORG; however, no limitation is intended thereby. For example, the organic EL elements OLED1 may include an organic light emitting layer which emits blue light, the organic EL element OLED2 may include an organic light emitting layer which emits green light, and the organic EL elements OLED3 may include an organic light emitting layer which emits red light, and in such a structural example, the color filter layer 220 may be omitted.

Figure 3:
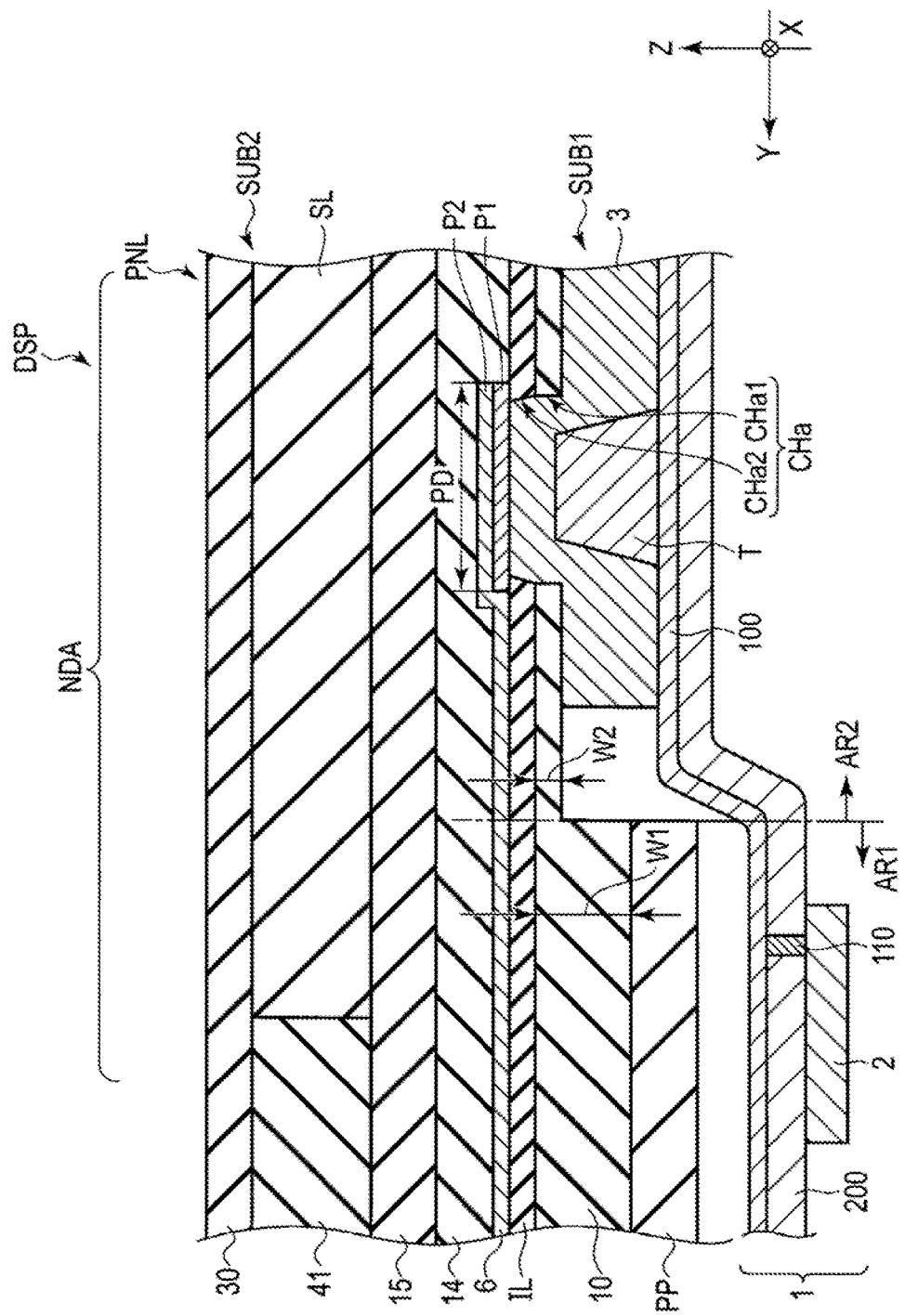
FIG. 3 is a cross-sectional view of the display device of FIG. 1 including a non-display area.

FIG. 3 is a cross-sectional view of the display device DSP of FIG. 1 including the non-display area NDA. Note that, in this example, the structure of the second substrate SUB2 is substantially the same as in FIG. 2, and thus, the detailed structure thereof will not be mentioned. Furthermore, in the present embodiment, viewing the first substrate SUB1 from the second substrate SUB2 will be defined as a plan view.

As shown in FIG. 3, the first substrate SUB1 and the second substrate SUB2 are adhered by an acrylate 41 and a sealant SL. The sealant SL is formed in the non-display area NDA. The acrylate 41 is disposed in an area surrounded by the first substrate SUB1, second substrate SUB2, and sealant SL. In the present embodiment, the acrylate 41 is formed of an epoxy, acryl, or epoxy acrylate resin material. Furthermore, the sealant SL is formed of an ultraviolet laser resistive material as will be described later, and is formed of, for example, a resin material having an acrylate skeleton.

In this example, the sealant SL is formed of an ultraviolet cured and thermal cured resin material. A formation process of the sealant SL will be explained briefly. Initially, a composition for a sealant is prepared. The composition is a precursor of the sealant SL, and is a liquid of high viscosity including optical cured resin monomer, polymerization initiator, cross-link agent, and various additives. Such a composition is applied to the first substrate SUB1 or the second substrate SUB2. The composition may be applied by drawing suing a dispenser, or by printing using a printing plate, or by drawing using an ink-jet device. Then, the first substrate SUB1 and the second substrate SUB2 are adhered and aligned, and the polymerization reaction of the composition is started through ultraviolet irradiation and heat application to the composition for the cure thereof. Note that, in the ultraviolet irradiation, the display area DA is, preferably, covered with a mask for ultraviolet-protection. Then, the composition is sintered to be fully cured.

Note that the acrylate 41 and the sealant SL may be formed of the same material or different materials. If the acrylate 41 and the sealant SL are formed of the same material, the acrylate 41 and the sealant SL is formed of an acryl or epoxy acrylate resin material. Or, the sealant SL may be omitted and the acrylate 41 may extend in the position of the sealant SL.

The first insulating substrate 10 includes a first area AR1 and a second area AR2 which are adjacent to each other. The first area AR1 corresponds to an area of the first insulating substrate 10 overlapping the protection member PP in the third direction Z, and the second area AR2 corresponds to an area of the first insulating substrate 10 not overlapping the first protection member PP in the third direction Z. The first protection member PP is disposed below the first area AR1 of the first insulating substrate 10 and is not disposed below the second area AR2.

The second area AR2 is formed thinner than the first area AR1. The first insulating substrate 10 has a thickness W1 in the first area AR1 and a thickness W2 in the second area AR2. The thickness W2 is less than the thickness W1. In the present embodiment, the thickness W1 is approximately 10 μm, and the thickness W2 is 1 μm or less, for example.

A pad electrode PD is formed above the first insulating substrate 10. Note that a second contact hole CHa2 is formed between the pad electrode PD and a first contact hole CHa1. As shown in FIG. 2, the first insulating film 11, second insulating film 12, and third insulating film 13 are disposed between the pad electrode PD and the first insulating substrate 10. Here, the first to third insulating films 11 to 13 disposed between the first insulating substrate 10 and the pad electrode PD are referred to as an insulating film IL. That is, the insulating film IL is an inorganic insulating film. Here, for example, the first insulating film 11 and the second insulating film 12 are formed of different materials. In the example depicted, the pad electrode PD is a multilayer of the first electrode P1 and the second electrode P2. The first electrode P1 is a transparent conductive layer formed of a transparent conductive material such as indium tin oxide (ITO). Furthermore, the first electrode P1 contacts an anisotropy conductive film 3. The second electrode P2 is disposed on the first electrode P1. The second electrode P2 is formed of a metal material such as aluminum. The first electrode P1 is formed in, for example, an island shape.

The fourth insulating film 14 and ribs 15 may be omitted above the pad electrode PD. Note that, if the fourth insulating film 14 and ribs 15 are disposed above the pad electrode PD, the fourth insulating film 14 and ribs 15 are formed of an ultraviolet laser resistive material which will be described later.

A contact hole CHa is formed passing through the first insulating substrate 10 and the insulating film IL to reach the pad electrode PD. The contact hole CHa includes a first contact hole CHa1 formed in the second area AR2 in the first insulating substrate 10 and a second contact hole CHa2 formed in the insulating film IL, which are continued together. The pad electrode PD is formed above the first contact hole CHa1 and the second contact hole CHa2. The pad electrode PD and the contact hole CHa are positioned immediately below the sealant SL. The pad electrode PD and the contact hole CHa overlaps the second area AR2 in the first insulating substrate 10 in the third direction Z. Note that, in the present embodiment, the first contact hole CHa1 corresponds to a first through hole. Furthermore, the second contact hole CHa2 corresponds to a second through hole.

A signal line 6 is, in the example depicted, formed on the insulating film IL and is formed in the same layer where the second electrode P2 of pad electrode PD is disposed. The signal line 6 is electrically connected to the pad electrode PD. The signal line 6 and the pad electrode PD may be formed separately or integrally. In the example depicted, the signal line 6 is formed integrally with the second electrode P2 of pad electrode PD. The signal line 6 corresponds to a power source line, and various control lines. The fourth insulating film 14 covers the signal line 6, pad electrode PD, and insulating film IL.

Note that, the signal line 6 and the pad electrode PD may be disposed in different layers. Furthermore, the signal line 6 and the pad electrode PD may be formed in different layers such that the signal line 6 and the pad electrode PD are electrically connected through a contact hole formed in an interlayer insulating film therebetween.

The line substrate 1 is disposed below the first insulating substrate 10. The line substrate 1 includes a core substrate 200, a connection line 100 disposed on the surface of the core substrate 200 to be opposed to the display panel PNL, and driver 2 disposed on the surface opposite to the surface of the core substrate 200 to be opposed to the display panel PNL. The core substrate 200 is disposed below the first area AR2 and second area AR2 of the first insulating substrate 10.

The connection line 100 includes a projection T. The projection T projects toward the first substrate SUB1. The projection T is formed such that at least a part thereof is disposed inside the contact hole CHa. The projection T is formed on, for example, the connection line 100 through plating or the like.

The driver 2 is electrically connected to the connection line 100 through a through hole 110 formed in the care substrate 200. The driver 2 functions as, for example, a signal supplier which supplies a signal to the display panel PNL for its drive. Note that the position of the driver 2 is not limited to the above, and it may be disposed on the surface of the core substrate 200 which is opposed to the display panel PNL.

The display panel PNL and the line substrate 1 are electrically connected and adhered together with an anisotropy conductive film 3 which is a conductive material. Specifically, the anisotropy conductive film 3 includes conductive particles (conductive materials CP which will be described later) dispersed in an adhesive agent. When the anisotropy conductive film 3 is interposed between the line substrate 1 and the display panel PNL, they are pressed vertically in the third direction Z and heated to achieve electrical and physical connection therebetween. The anisotropy conductive film 3 is, between the display panel PNL and the line substrate 1, filled inside the contact hole CHa from the lower surface of the first insulating substrate 10 to contact and electrically connect with the first electrode P1 of the pad electrode PD. Furthermore, the anisotropy conductive film 3 contacts and electrically connects with the projection T of the connection line 100. Thereby, the connection line 100 is electrically connected to the pad electrode PD and the signal line 6 through the anisotropy conductive film 3.

Figure 4:
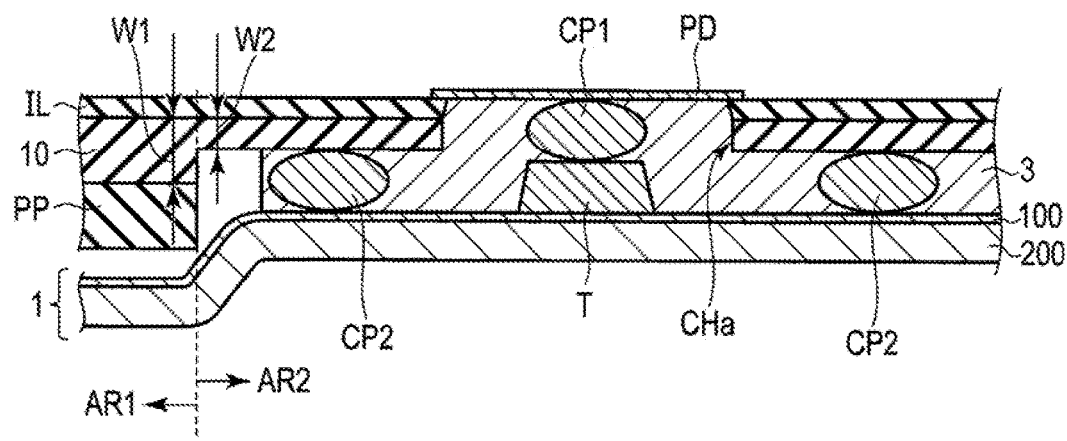
FIG. 4 is a cross-sectional view showing a part of the display device of FIG. 3 in an enlarged manner, in which a line substrate, anisotropy conductive film, first insulating substrate, insulating film, pad electrode, and the like are depicted.

FIG. 4 is a cross-sectional view showing a part of the display device DSP of FIG. 3 in an enlarged manner, in which the line substrate 1, anisotropy conductive film 3, first insulating substrate 10, insulating film IL, pad electrode PD, and the like are depicted.

As shown in FIG. 4, a conductive particle CP1 in the anisotropy film 3 is interposed between the pad electrode PD and the projection T of the connection line 100 in the contact hole CHa. When the line substrate 1 is pressed against the display panel PNL, the conductive particle CP1 is crushed between the projection T and the pad electrode PD to establish electrical connection therebetween. Furthermore, in the example depicted, conductive particles CP2 in the anisotropy conductive film 3 in the second area AR2 are interposed between the first insulating substrate 10 and the connection line 100 outside the contact hole CHa. In this state, the conductive particles CP2 may be lodged in between the first insulating substrate 10 and the connection line 100. In the present embodiment, a state where the conductive particles CP2 are lodged means that the conductive particles CP2 are not pressed any further by the pressure applied thereto when the line substrate 1 and the display panel PNL are adhered together by pressing. The conductive particles CP1 and CP2 may be, for example, entirely formed of a metal or may be formed, of a resin material coated with a metal material such as nickel or gold.

Note that, between the line substrate 1 and the display panel PNL, two or more conductive particles CP are not made conductive while being stacked in the third direction Z. Furthermore, for example, in both the first direction X and second direction Y, an adhesive agent (insulative material) which is a material for the anisotropy conductive film 3 is filled between adjacent conductive particles CP, and thus, the conductive particles CP are rarely made conductive in both the first direction X and second direction Y.

Note that the surface of the connection line 100 which contacts the anisotropy conductive film 3 may have the projection T as shown or may be flat without any projection. With the projections T formed as above, a greater number of conductive particles CP1 between the connection line 100 and the pad electrode PD can be crushed by the projections T. Thereby, the electric connection between the connection line 100 and the pad electrode PD can be established more firmly with a smaller pressure force. Thus, as compared to a case where there is no projection T, the productivity and reliability of both the product and its production can be improved.

Figure 5:
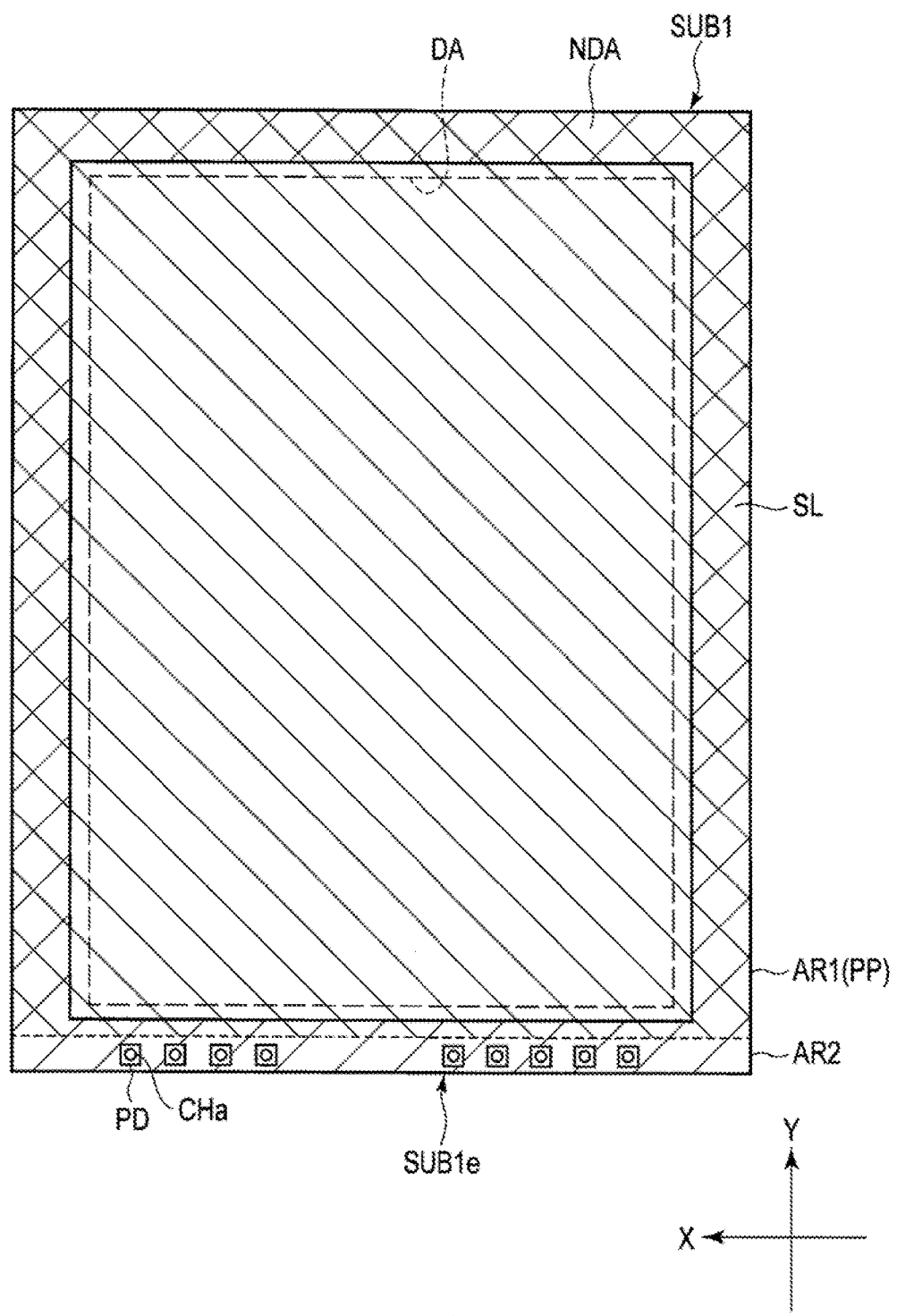
FIG. 5 is a plan view of a first substrate of the embodiment, in which positions of a first area and a second area or the like are depicted.

FIG. 5 is a plan view of the first substrate SUB1 of the above embodiment, in which positions of the first area AR1 and the second area AR2 or the like are depicted. In FIG. 5, the area where the sealant SL is formed is hatched up to right and is arranged to surround the display area DA.

The first insulating substrate 10 as in FIG. 3 is disposed over the entirety of the first substrate SUB1. The first area AR1 is, in a plan view, an area where the protection member PP is disposed to overlap the first insulating substrate 10. The second area AR2 is, in a plan view, an area where the protection member PP does not overlap the first insulating substrate 10. Furthermore, as aforementioned, the thickness W2 of the second area AR2 is less than the thickness W1 of the first area AR1.

In FIG. 5, the first area AR1 is hatched up to left. The protection member PP is disposed to overlap the entirety of the first area AR1. The second area AR2 is adjacent to the first area AR1 and extends in the first direction X in the non-display area MDA in one end SUB1e side of the first substrate SUB1. A plurality of pad electrodes PD and contact holes CHa overlap the second area AR2 in a plan view and are arranged along the first direction X. That is, the pad electrodes PD and the contact holes CHa are disposed to overlap the thinner area of the first insulating substrate 10. Furthermore, the contact holes CHa are formed in a position overlapping the sealant SL in a plan view.

Now, a manufacturing method of the display device of the present embodiment will be explained with reference to FIGS. 6 to 10. In FIGS. 6 to 10, the structure above the pad electrode PD is equal to that of the pad electrode PD of the display panel PNL of FIG. 3, and thus, the depiction thereof is omitted.

FIG. 6 is a cross-sectional view of a process in which a support substrate 5 is peeled off from the first insulating substrate 10. That is, on the support substrate 5, members of the first substrate SUB1 including the first insulating substrate 10, insulating film 11, pad electrode PD, signal line 6 and the like are formed one after another, and the second substrate SUB2 is adhered thereto.

Then, laser LL1 is irradiated from the rear surface side of the support substrate 5 to peel the support substrate 5 from the first insulating substrate 10. Here, in the present embodiment, the support substrate 5 is formed of glass and the first insulating substrate 10 is formed of polyimide. The laser LL1 irradiated from the rear surface side of the support substrate 5 reaches the surface 10A of the first insulating substrate 10. The first insulating substrate 10 absorbs and resolves the laser LL1 at the interface between the support substrate 5 and the first insulating substrate 10. Thereby, a space is created at the interface between the support substrate 5 and the first insulating substrate 10, and the support substrate 5 is peeled off from the first insulating substrate 10.

FIG. 7 is a cross-sectional view showing a process in which the protection member PP is adhered to the first insulating substrate 10.

The protection member PP is adhered to the first insulating substrate 10 by an adhesive sheet (not shown). Specifically, while the adhesive sheet is disposed between the first insulating substrate 10 and the protection member PP, alignment of the protection member PP is performed, and a heat treatment is performed to make the adhesive sheet adhesive to adhere the protection member PP to the bottom of the first insulating substrate 10. Thereby, a misalignment of the protection member PP can be suppressed.

Note that, before adhering the protection member PP to the first insulating substrate 10, a metal layer may be formed on the surface B of the protection member PP. The metal layer is formed by, for example, depositing a metal material on the surface B of the protection member PP.

Figure 8:
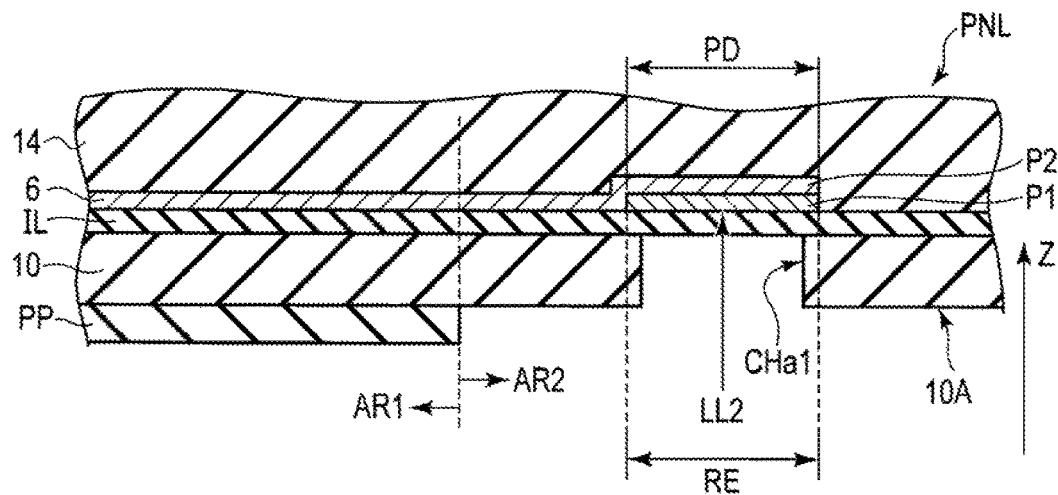
FIG. 8 is a cross-sectional view showing a process in which a first contact hole is formed in the first insulating substrate.

FIG. 8 is a cross-sectional view showing a process in which a first contact hole CHa1 is formed in the first insulating substrate 10.

After the adhesion of the protection member PP, ablation by excimer laser is performed. That is, the first contact hole CHa1 is formed in the first insulating substrate 10 by ablation using ultraviolet of wavelength less than 350 nm. That is, from the lower side of the first substrate SUB1, laser LL2 is irradiated to the area overlapping the pad electrode PD to form the first contact hole CHa1 in the second area AR2 of the first insulating substrate 10 reaching the insulating film IL. At that time, in the area where the laser LL2 is irradiated, the first insulating substrate 10 absorbs the laser LL2 and resolves to form the first contact hole CHa1. The first contact hole CHa1 is formed in an area RE overlapping the pad electrode PD in the third direction Z. Thus, the portion of the laser LL2 passing the insulating film IL through the first contact hole CHa1 is blocked by the pad electrode PD.

In the present embodiment, an excimer laser device is used as a source of the laser LL2. The excimer laser device will be, for example, a KrF laser device having an emission wavelength of 248 nm, ArF laser device having an emission wavelength of 193 nm, XeF laser device having an emission wavelength of 351 nm, or XeCl laser device having an emission wavelength of 308 nm. In the present embodiment, laser of wavelength of 258 nm or less should be used and the device is KrF laser device, for example.

Note that the formation of the first contact hole CHa1 shown in FIG. 8 may be performed before the adhesion of the protection member PP shown in FIG. 7.

Figure 9:
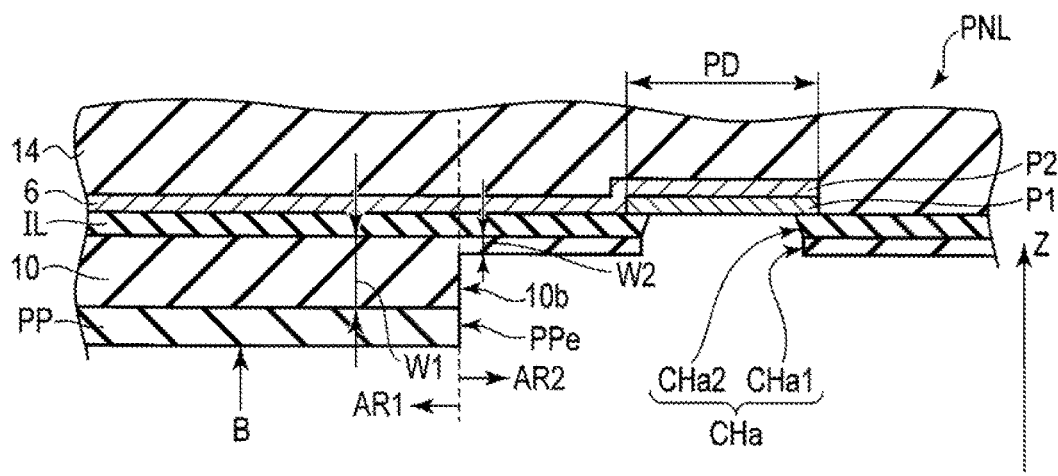
FIG. 9 is a cross-sectional view showing a process in which the first insulating substrate is thinned in the second area and a second contact hole is formed in an insulating film.

FIG. 9 is a cross-sectional view showing a process in which the first insulating substrate 10 is thinned in the second area AR2 and a second contact hole CHa2 is formed in the insulating film IL.

After the first contact hole Cha1 is formed in the first insulating substrate 10, a second contact hole CHa2 is formed in the insulating film IL. The insulating film IL is trimmed in the first contact hole CHa1 through an ashing process to form the second contact hole CHa2. The second contact hole CHa2 is formed in a position overlapping the first contact hole CHa1. The second contact hole CHa2 continues the first contact hole CHa1, and is formed between the pad electrode PD and the first contact hole CHa1. A gas used in the ashing process is, for example, sulfur hexafluoride (SF6).

In the same process where the second contact hole CHa2 is formed, the first insulating substrate 10 is thinned in the second area AR2. Specifically, the first insulating substrate 10 exposed from the protection member PP in the second area AR2 is trimmed by the ashing process to form the second contact hole CHa2. The first insulating substrate 10 in the first area AR1 is not trimmed since it is covered with the protection member PP. Thus, the thickness W1 of the first area AR1 is maintained as is before the ashing process, and the second area AR2 becomes thinner than the first area AR1. At that time, the protection member PP functions as a mask to prevent fragments from the first area AR1 in the ashing process. Furthermore, if a metal layer is formed on the surface B of the protection member B, the metal layer has a resistance to the gas used in the ashing process, and thus, fragments from the protection member PP and deterioration in the properties required for the protection member PP (such as heat resistivity, gas insulation, anti-humidity, and strength) can be suppressed.

Here, the insulating film IL and the first insulating substrate 10 react to the gas used in the ashing process in different speeds. Thus, in consideration of the reaction speed of each of the insulating film IL and the first insulating substrate 10 in the ashing process, the thickness thereof before the ashing process is determined. Thus, in the second area AR2, the first insulating substrate 10 can be trimmed to a desired thickness W2 while the insulating film IL is trimmed and pierced to reach the pad electrode PD.

As can be understood from the above, the process of forming the second contact hole CHa2 of the insulating film IL and the process of thinning the first insulating substrate 10 can be performed concurrently in the present embodiment. Consequently, the first insulating substrate 10 can toe thinned without an additional process. Furthermore, the production cost can be suppressed.

As can be understood from the above, the ashing process of the first insulating substrate 10 is performed using the protection member PP as a mask, and thus, a boundary surface 10b between the first area AR1 and the second area AP2 is positioned directly above the end surface PPe of the protection member PP.

Figure 10:
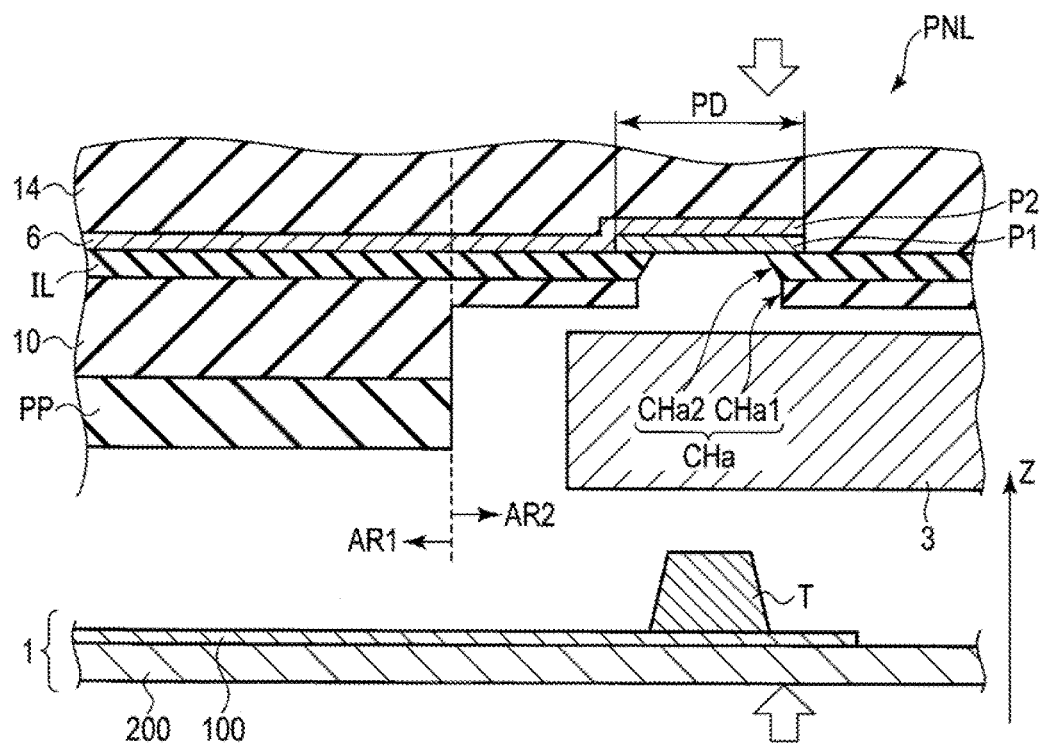
FIG. 10 is a cross-sectional view showing a process in which the line substrate is pressed to the display panel.

FIG. 10 is a cross-sectional view showing a process in which the line substrate 1 is pressed to the display panel PNL.

As shown in FIG. 10, after the formation of the contact hole CHa in the first substrate SUB1, the line substrate 1 is pressed to the display panel PNL using the anisotropy conductive film 3. Specifically, the anisotropy conductive film 3 is disposed between the line substrate 1 and the display panel PNL to be opposed to the contact hole CHa, and a force is applied from the lower side of the line substrate 1 and the upper side of the display panel PNL as shown by arrows in FIG. 10 and heat is applied thereto. Thereby, the anisotropy conductive film 3 melts and permeates into the contact hole CHa, and conductive particles included in the anisotropy conductive film 3 contact the pad electrode PD to achieve electrical and physical connection between the line substrate 1 and the display panel PNL.

Through the above processes, the line substrate 1 is pressed to the display panel PNL.

Figure 11:
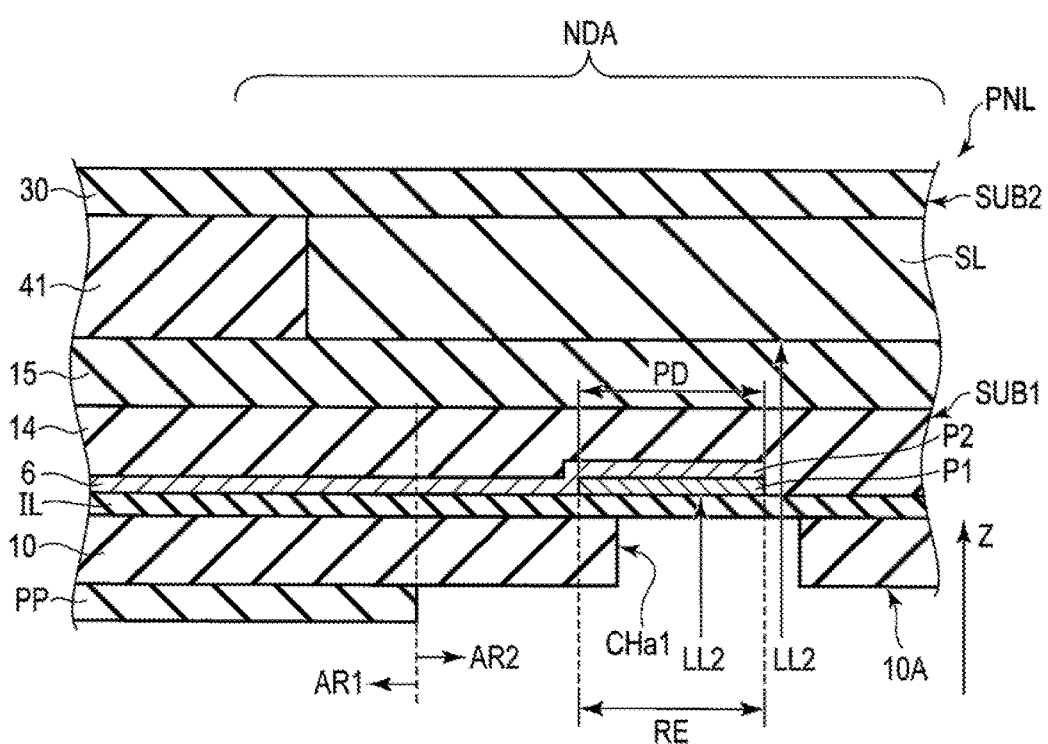
FIG. 11 is a cross-sectional view showing another process of forming a first contact hole in the first-insulating substrate of FIG. 8.

FIG. 11 is a cross-sectional view showing another example of forming a first contact hole CHa1 in the first insulating substrate 10 of FIG. 8. In this example, the first contact hole CHa1 is formed to be shifted from the area RE overlapping the pad electrode PD, and in this respect, this example differs from the example of FIG. 8. The first contact hole CHa1 is formed in a position overlapping the sealant SL.

As in the example of FIG. 8, in the area where the laser LL2 is irradiated, the first insulating substrate 10 absorbs the laser LL2 and resolves, and the first contact hole CHa1 is formed. In the formation of the first, contact hole CHa1, the laser LL2 irradiated in the area RE overlapping the pad electrode PD passes the insulating film IL through the first contact hole CHa1 and is blocked by the pad electrode PD, and the laser LL2 irradiated may miss the area RE overlapping the pad electrode to reach the sealant SL passing the insulating film IL, fourth insulating film 14, and rib 15.

The first insulating substrate 10 and sealant SL react the laser LL2 if the absorption wavelength to ultraviolet of the first insulating substrate 10 and the sealant SL and the emission wavelength of ultraviolet of the laser LL2 match. In the present embodiment, the sealant SL has light absorbing ratio to ultraviolet wavelength less than 350 nm which is lower than that of the first insulating substrate 10. Here, since the laser LL2 is 258 nm or less, the laser LL2 reacts with the first insulating substrate 10 and barely reacts with the sealant SL.

However, depending on the material used therein, the sealant SL reacts with the ultraviolet light in the laser LL2 and the sealant SL may resolve and sublimate. In such a case, the signal line 6 and the pad electrode PD may be damaged.

In the present embodiment, the sealant SL is formed of a material having a lower light absorbing ratio to ultraviolet wavelength less than 350 nm than that of the first insulating substrate 10, that is, a material having an acrylate skeleton such as an acryl resin or an epoxy acrylate resin. Thus, if the laser LL2 misses the area RE overlapping the pad electrode PD and is irradiated on the first insulating substrate 10 during the formation of the first contact hole CHa1, the laser LL2 after passing through the first insulating substrate 10 does not substantially react with the sealant SL. Therefore, a line cut in the signal line 6 and damage of the pad electrode PD caused by misalignment of the first contact, hole CHa1 can be suppressed and decrease of productivity can be prevented.

Furthermore, in the present embodiment, the first insulating substrate 10 is thinner in the second area AR2 than is in the first area AR1. Therefore, as in FIG. 4, even if the conductive particles CP2 are interposed and pressed between the connection line 100 and the first insulating substrate 10, a gap between the pad electrode PD and the projection T of the connection line 100 in a position opposed to the contact hole CHa can be decreased to sufficiently press the conductive particle CP1. That is, the conductive particle CP1 between the connection line 100 and the pad electrode PD can be pressed and crushed before the conductive particles CP2 are lodged between the connection line 100 and the first insulating substrate 10. Thus, the connection between the connection line 100 and the pad electrode PD can be established more efficiently.

Furthermore, in the present embodiment, the display device DSP includes the line substrate 1 disposed below the display panel PNL (in the rear surface side which is opposite to the display surface) wherein the line substrate 1 and the display panel PNL are electrically connected through the conductive material (anisotropy conductive film 3 in the above example) in the contact hole CHa. Furthermore, the driver 2 is disposed below the display panel PNL. Since the area of the first substrate SUB1 is not required to be enlarged to mount the driver 2 or the line substrate 1 thereon, the first substrate SUB1 and the second substrate SUB2 cars be formed substantially even. Furthermore, in the area where the first substrate SUB1 and the second substrate SUB2 are opposed to each other, the display area DA can be increased. That is, in the display surface of the display device DSP of the present embodiment, the area of the display area DA used for display can be increased, and a thinner bezel structure can be achieved.

Furthermore, since there is no need of a long flexible printed circuit used for the electrical connection between the part of the first substrate SUB1 which is opposed to the second substrate SUB2 and the line substrate 1, or a space to accommodate a bent flexible printed circuit, the display device DSP can be miniaturized. Furthermore, an electronic device including the display device DSP can be miniaturized, too.

Furthermore, since a possible breakdown of the lines when the flexible printed circuit is bent can be avoided, the display device DSP can be more reliable.

FIG. 12 is a schematic plan view showing positional relationships between the pad electrode PD and the first contact hole CHa1.

In the example of FIG. 12(a), the first contact hole CHa1 is formed in the area of the pad electrode PD. This is a structure corresponding to the example of the first contact hole CHa1 and the pad electrode PD shown in FIG. 8. The laser to form the first contact hole CHa1 is blocked by the pad electrode PD and does not reach the sealant SL. In the example of FIG. 12(b), the first contact hole CHa1 is shifted in the second direction Y as compared to the example of FIG. 12(a), and the first contact hole CHa1 is formed partly out of a side edge PDX of the pad electrode PD, which is parallel to the first direction X. This is a structure corresponding to the example of the first contact hole CHa1 and the pad electrode PD shown in FIG. 11.

In the example of FIG. 12(c), the first contact hole CHa1 is shifted in the first direction X as compared to the example of FIG. 12(a), and the first contact hole CHa1 is formed partly out of a side edge PDY of the pad electrode PD, which is parallel to the second direction Y. Even if there is a misalignment of the first contact hole CHa1, the same advantage explained above can be achieved.

In the example of FIG. 12(d), the first contact hole CHa1 is expanded in the first direction X to be greater than the width of the pad electrode PD and is formed to be partly out of the side edges PDY1 and PDY2 of the pad electrode PD in the first direction X. For example, even if the pad electrode PD is reduced, in width in the first direction X for higher definition of the display device, and the size of the first contact hole CHa1 is made smaller than the size of the pad electrode PD, the same advantage explained above can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the above insulating film IL includes the first insulating film 11, second insulating film 12, and third insulating film 13; however, no limitation is intended, thereby. Various changes can be applied thereto. For example, the insulating film IL may be a monolayer insulating film, or may be a double-layered insulating film, or may be an insulating film including four or more layers.

Furthermore, in the above embodiment, the sealant SL is used as an organic member which is directly above the pad electrode PD between the first substrate SUB1 and the second substrate SUB2; however, no limitation is intended thereby. For example, a different organic member may be interposed between the first substrate SUB1 and the sealant SL. In that case, the organic member is closer to the pad electrode PD that is the sealant SL, and thus, the organic member is formed of a resin material of acryl or epoxy acrylate as in the above embodiment while the sealant SL which is above the organic member may be formed of various materials. Furthermore, the sealant SL surrounding the display area DA may be omitted. In that case, the acrylate 41 shown in FIG. 3 or the like may extend to the part directly above the pad electrode PD. At that time, the acrylate 41 is formed of a resin material of acryl or epoxy acrylate as in the above embodiment.

Furthermore, the above organic member may be interposed between the acrylate 41 and the first substrate SUB1.

The above embodiment may be applied to a liquid crystal display device instead of an organic electroluminescent display device. In that case, the display panel PNL is, for example, a liquid crystal display panel including a liquid crystal layer interposed between the first substrate SUB1 and the second substrate SUB2. A liquid crystal display panel as the display panel PNL may be of reflective type which selectively reflects light incident from the second substrate SUB2 side of may be of transmissive type which selectively transmits light incident from the second substrate SUB2 side. Note that, in a plan view, if the display area DA and the line substrate 1 overlap each other, the reflective, type is suitable; however, the reflective type may be adopted when a backlight unit can foe dispose between the first substrate SUB1 and the line substrate 1. Note that the main structure of the present embodiment is substantially the same even if the display device DSP is a liquid crystal display device.

What is claimed is:

1. A display device comprising:
a first substrate including an insulating substrate with a first through hole, a pad electrode positioned above the insulating substrate, and a signal line electrically connected to the pad electrode;
a second substrate opposed to the first substrate;
a sealant which adheres the first substrate and the second substrate;
a line substrate including a connection line and disposed below the insulating substrate; and
a conductive material which electrically connects the pad electrode and the connection line, wherein
the pad electrode and the first through hole overlap the sealant,
a first part of the first through hole does not overlap the pad electrode and overlaps the sealant, and a second part of the first through hole overlaps both of the pad electrode and the sealant, and
the sealant is less absorptive than is the insulating substrate as to a wavelength less than 350 nm.

2. The display device of claim 1, wherein the sealant is formed of a material having an acrylate skeleton.

3. The display device of claim 1, further comprising an adhesive agent surrounded by the sealant.

4. The display device of claim 3, wherein the adhesive agent is formed of a material which is different from that of the sealant.

5. The display device of claim 1, further comprising an insulating film between the insulating substrate and the pad electrode, and a second through hole between the pad electrode and the first through hole, the second through hole being connected to the first through hole.

6. The display device of claim 5, wherein the insulating film is an inorganic insulating film.

7. The display device of claim 6, wherein the insulating film includes at least a first insulating film and a second insulating film, and the first insulating film and the second insulating film are formed of different materials.

8. The display device of claim 1, wherein the insulating substrate is a resin substrate.

9. The display device of claim 1, wherein the pad electrode includes a first electrode contacting the conductive material, and
the first electrode is a transparent conductive layer.

10. The display device of claim 9, wherein the pad electrode includes a second electrode disposed on the first electrode, and
the second electrode is formed of a metal material.

11. The display device of claim 1, further comprising a light emitting element disposed between the first substrate and the second substrate.

12. A display device comprising:
a first substrate including an insulating substrate with a first through hole, a pad electrode positioned above the insulating substrate, and a signal line electrically connected to the pad electrode;
a second substrate opposed to the first substrate;
an organic member positioned between the first substrate and the second substrate;
a line substrate including a connection line and disposed below the insulating substrate; and
a conductive material which electrically connects the pad electrode and the connection line, wherein
the pad electrode and the first through hole overlap the organic member,
a first part of the first through hole does not overlap the pad electrode and overlaps the organic member, and a second part of the first through hole overlaps both of the pad electrode and the organic member, and
the organic member is less absorptive than is the insulating substrate as to a wavelength less than 350 nm.

13. The display device of claim 12, wherein the organic member is formed of a material having an acrylate skeleton.

14. The display device of claim 12, wherein the insulating substrate is a resin substrate.

15. The display device of claim 12, further comprising an insulating film between the insulating substrate and the pad electrode, and a second through hole between the pad electrode and the first through hole, the second through hole being connected to the first through hole.

16. The display device of claim 15, wherein the insulating film is an inorganic insulating film.

17. The display device of claim 16, wherein the insulating film includes at least a first insulating film and a second insulating film, wherein
the first insulating film and the second insulating film are formed of different materials.

18. The display device of claim 12, wherein the pad electrode includes a first electrode contacting the conductive material, and
the first electrode is a transparent conductive layer.

19. The display device of claim 18, wherein the pad electrode includes a second electrode disposed on the first electrode, and
the second electrode is formed of a metal material.

* * * * *